(12) United States Patent
Yoon

(10) Patent No.: US 6,205,068 B1
(45) Date of Patent: Mar. 20, 2001

(54) DYNAMIC RANDOM ACCESS MEMORY DEVICE HAVING A DIVIDED PRECHARGE CONTROL SCHEME

(75) Inventor: Hong-Il Yoon, Seoul (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 09/352,622

(22) Filed: Jul. 13, 1999

(30) Foreign Application Priority Data

Jul. 13, 1998 (KR) .................................................. 98-28193

(51) Int. Cl.[7] .................................................. G11C 7/00
(52) U.S. Cl. ............................................. 365/203; 365/207
(58) Field of Search .................................. 365/203, 207, 365/190

(56) References Cited

U.S. PATENT DOCUMENTS

| | | | | |
|---|---|---|---|---|
| 4,658,381 | * | 4/1987 | Reed et al. ............................. | 365/203 |
| 4,758,990 | * | 7/1988 | Venida .................................. | 365/203 |
| 4,893,278 | * | 1/1990 | Ito ........................................ | 365/203 |
| 5,036,492 | * | 7/1991 | Runaldue ............................. | 365/203 |
| 5,315,555 | * | 5/1994 | Choi .................................... | 365/203 |
| 5,355,343 | * | 10/1994 | Shu et al. ............................. | 365/203 |
| 5,444,662 | * | 8/1995 | Tanalla et al. ....................... | 365/203 |
| 5,619,466 | * | 4/1997 | McClure .............................. | 365/207 |
| 5,841,716 | * | 11/1998 | Iwaki ................................... | 365/207 |
| 5,905,685 | * | 5/1999 | Nakamura et al. .................. | 365/207 |

* cited by examiner

Primary Examiner—Tan T. Nguyen
(74) Attorney, Agent, or Firm—Marger Johnson & McCollom, P.C.

(57) ABSTRACT

A random access memory device provides high speed access by utilizing a divided precharge control scheme to reduce the loading on equalization signal lines. The equalization lines are driven at voltages which are greater than the internal operating voltage of the device, thereby reducing the row precharge time and further increasing the access speed. The device includes a plurality of bit line pairs for transferring data from memory cells. Each bit line pair is coupled to a bit line equalization circuit which includes a pair of precharge transistors that precharge the bit lines in response to a first bit line equalization signal, and an equalization transistor that equalizes the voltage of the bit lines in response to a second bit line equalization signal. The first bit line equalization signal is preferably driven at a boost voltage level, and the second bit line equalization signal is preferably driven at an external voltage level. The memory device also includes a plurality of sense amplifiers, each of which has a pair of sense amplifier nodes that are precharged by a corresponding sense amplifier equalization circuit. Each sense amplifier equalization circuit includes a pair of precharge transistors that precharge the sense amplifier nodes to the precharge voltage in response to a first latch enable equalization signal, and an equalization transistor that equalizes the voltage of the sense amplifier nodes in response to a second latch enable equalization signal. A latch enable equalization signal generator similar to the bit line equalization signal generator generates the first and second latch enable equalization signals at the boost voltage level and the external voltage level, respectively, in response to the control signal.

18 Claims, 8 Drawing Sheets

DYNAMIC RANDOM ACCESS MEMORY DEVICE HAVING A DIVIDED PRECHARGE CONTROL SCHEME

This application claims priority from Korean patent application No. 98-28193 filed Jul. 13, 1998 in the name of Samsung Electronics Co., Ltd., which is herein incorporated by reference.

BACKGROUND OF THE INVENTION

1. Field of the Invention

The present invention relates to semiconductor memory devices, and more particularly to a dynamic random access memory device with a divided precharge control scheme capable of realizing high-speed access with a low power supply voltage.

2. Description of the Related Art

As the integration densities of semiconductor memory devices continues to increase, there is a continuing need to reduce the power supply voltages to the semiconductor memory devices to, among other things, minimize total power consumption and compensate for the smaller sizes of the discrete devices therein. In particular, in order to scale the size of MOS devices contained on a memory integrated circuit (IC), it is typically necessary to reduce the thickness of the gate oxide and the line widths of the gate electrodes and other interconnect lines connected to the MOS devices. Moreover, to achieve reliable operation of such reduced size devices, it is necessary to reduce the voltages at which these devices operate.

For example, in a 256-Mb dynamic random access memory (DRAM), it is typically necessary to reduce the external power supply voltage of about 3.3 volts, which is applied to the memory IC, to an internal voltage of about 1.5 volts (i.e., IVC=1.5 volts) in order to obtain reliable operation. However, as will be understood by those skilled in the art, decreasing the operating voltage typically reduces the sensing, amplification, and drive capability of sense amplifiers used to sense data stored in memory cell and limits the degree to which the sense amplifiers can adequately refresh memory cells after a read operation.

FIG. 1 shows the structure of a memory cell array and the peripheral circuits required for read and write operations in a conventional dynamic random access memory device. Each memory cell MC includes an access transistor 10 which serves as a switch, and a capacitor 12 which holds a bit of data. The gates of the access transistors 10 which are arranged in the same row are connected to a common word line WLi, where i=(1, 2, 3, . . . , n). The sources of the access transistors 10 which are arranged in a column are connected to alternate lines of a bit line pair BLj and BLjB, where j=(1, 2, . . . , m). One electrode of each capacitor 12 is connected to the drain of the corresponding access transistor 10, while the other electrode is connected to receive a plate voltage $V_P$.

When a row address is supplied, it is decoded by a row decoder 14 into a row address signal, and one word line corresponding to the decoded row address is activated, thus turning on all the access transistors 10 connected to the activated word line. The stored charge on all the capacitors 12 corresponding to the activated word line flow onto the bit lines coupled to the capacitors 12. Owing to the relatively low capacitance of the capacitors 12 used in the memory device, sense amplifier circuits 16 are used to amplify the slight effect which the capacitor has on the bit line pair. Each of the sense amplifier circuits 16 draws the potential of the bit line having the lowest voltage to VSS, and raises the potential of the bit line having the higher voltage up to IVC. Only one of the amplified signals passes through the I/O gate circuit 20 corresponding to a decoded column address from column decoder 18.

FIG. 2 is a circuit diagram of a conventional sense amplifier circuit 16 associated with one of the memory cells of FIG. 1. Sense amplifier circuit 16 includes a pair of bit lines BL and BLB, a bit line equalization circuit 26, a sense amplifier 28, a column select gate 30, a sense amplifier equalization circuit 32, and a sense amplifier activating circuit 34. The bit lines BL and BLB, to which data is transferred, are connected to the memory cell MC. Each memory cell MC has an access transistor 10 coupled to a word line and a bit line, and a capacitor 12 coupled between the access transistor 10 and the plate voltage $V_P$.

The bit line equalization circuit 26 receives a precharge voltage VBL and equalizes the bit lines BL and BLB to the precharge voltage level before a read operation or a write operation is performed. The sense amplifier 28 differentially amplifies the data transferred from the memory cell MC to the bit lines BL and BLB. The column select gate 30 connects the bit lines BL and BLB to the input/output lines IO and IOB in response to the column select line signal CSL. The sense amplifier equalization circuit 32 equalizes the sense amplifier nodes to the precharge voltage VBL. Once equalized, P-type sense amplifier and N-type sense amplifier latch enable signals LA and LAB, which control the sense amplifier 28, are activated as a result of the sense amplifier activating circuit 34, which is connected to the sense amplifier equalization circuit 32 and receives the sense amplifier activating signal LAPG and LANG.

The bit line equalization circuit 26 has three NMOS transistors M1, M2 and M3 connected between the bit lines BL and BLB. The transistors M1, M2 and M3 have gate electrodes for receiving a bit line equalization signal PEQ. Further, the precharge voltage VBL is input to the source electrodes of the NMOS transistors M1 and M2. The sense amplifier 28 is comprised of a P-type sense amplifier and an N-type sense amplifier. The P-type sense amplifier has PMOS transistors M4 and M5 which are connected in series between the bit lines BL and BLB. The P-type sense amplifier latch enable signal LA is input to the commonly connected source electrodes of the PMOS transistors M4 and M5, with the gate electrodes of the PMOS transistors M4 and M5 connected to the bit lines BL and BLB, respectively. The N-type sense amplifier has two NMOS transistors M6 and M7 connected in series to the bit lines BL and BLB. The N-type sense amplifier latch enable signal LAB is input to the commonly connected source electrodes of the NMOS transistors M6 and M7. The gates of transistors M6 and M7 are connected to the bit lines BL and BLB, respectively.

The column select gate 30 has two NMOS transistors M8 and M9 whose gate electrodes are coupled to the column select line CSL. The transistors M8 and M9 connect the bit lines BL and BLB to the input/output lines IO and IOB under control of the column select line CSL. The sense amplifier equalization circuit 32 has three NMOS transistors M10, M11 and M12 whose gate electrodes are collectively connected to a latch enable equalization signal PLAEQ. The sense amplifier activating circuit 34 has PMOS and NMOS transistors M13 and M14. The PMOS transistor M13 has its gate electrode connected to a P-type sense amplifier activating signal LAPG and its current path formed between the signal line LA and the internal power supply voltage IVC. The NMOS transistor M14 whose gate electrode is connected to a N-type sense amplifier activating signal LANG, has its current path formed between the signal line LAB and VSS.

FIG. 3A is an example of the bit line equalization signal generator 22 illustrated in FIG. 1. The bit line equalization signal generator 22 as shown in FIG. 3A has a PMOS transistor M15 and an NMOS transistor M16 which are connected in series between the internal power supply voltage IVC and the ground voltage VSS and have their gate electrodes commonly connected to a control signal PBLS. The bit line equalization signal PEQ is maintained at the level of the ground voltage VSS or the internal power supply voltage IVC according to the logic level of the control signal PBLS.

FIG. 3B is an example of the latch enable equalization signal generator 24 illustrated in FIG. 1. The latch enable equalization signal generator 24 has a PMOS transistor M17 and an NMOS transistor M18 which are connected in series between the internal power supply voltage IVC and the ground voltage VSS. The gate electrodes of the transistors M17 and M18 are commonly connected to the control signal PBLS. The control signal PBLS is used as a block select signal and determines whether a corresponding sense amplifier is enabled.

When cell data is at a "1" level for the memory cell MC and the word line WL is enabled, the voltage level of the bit line BL is raised by $\Delta$VBL due to charge sharing between the bit line BL and the cell capacitor 12. After the charge sharing is completed, if the N-type sense amplifier activating signal LANG is changed from the low level to the high level, the voltage level of the N-type sense amplifier enable signal LAB is lower than the level of the precharge voltage and the NMOS transistors M6 and M7 turn on and perform a sensing operation. Since the voltage level of the bit line BL is higher than that of the bit line BLB, the transistor M7 is thus turned on much more than transistor M6, which causes the bit line BLB to fall to a lower voltage level while the level of the bit line BL remains at its level of $\frac{1}{2}$IVC+$\Delta$VBL.

As the voltage level of the bit line BLB falls, the P-type sense amplifier activating signal LAPG is changed from the high level to the low level and the PMOS transistor M13 is thus turned on, so that the PMOS transistors M4 and M5 are turned on. At this time, since the PMOS transistor M4 is more easily turned on than the PMOS transistor M5, the difference between the voltages of the bit lines BL and BLB increases. During a read operation, once the voltage difference between the bit lines BL and BLB is more than a certain level, the column select line CSL is enabled to the high level and the NMOS transistors M8 and M9 are turned on. The bit lines BL and BLB are thus connected to the input/output lines IO and IOB and the bit line data is transferred to the input/output line.

If the bit line equalization signal PEQ is driven at the voltage level of the internal power supply voltage IVC, the bit lines BL and BLB, which initially are at the internal power supply voltage IVC and the ground voltage VSS, are equalized by the NMOS transistors M1, M2 and M3 to the precharge voltage VBL (typically $\frac{1}{2}$IVC). The internal power supply voltage IVC is used rather than the external power supply voltage EVC to reduce operating current and noise. Similarly, when the latch enable equalization signal PLAEQ is driven at the voltage level of the internal power supply voltage IVC, the NMOS transistors M10, M11 and M12 operate, and the source electrodes of transistors M4, M5, M6, and M7, that is, the sense amplifier nodes, are also equalized to the precharge voltage VBL. In a semiconductor memory device using an external power supply voltage EVC of 5V or 3.3V, the internal power supply voltage IVC is generally about 2.8V–3V and the level of the precharge voltage VBL is about 1.4V–1.5V. With voltages at these levels, there is typically no problem with the equalization operation.

However, if the level of the internal power supply voltage IVC is lowered in response to a lowering of the external power supply voltage EVC (for example, to about 2V), the internal power supply voltage IVC becomes about 1V. If these voltage levels are used, problems arise if the equalization circuits 26 and 32 previously described are used. At these voltages, the threshold voltage of NMOS transistor M3 of the bit line equalization circuit 26 becomes more than about 1V due to the body effect. Therefore, as the bit line BLB arrives at the precharge voltage VBL, the drain-source voltage Vds becomes small and the NMOS transistor M3 is almost turned off, so that it is difficult to smoothly perform a charge sharing operation.

Further, a gate-source voltage Vgs of the NMOS transistor M1 becomes almost 1V which prevents the NMOS transistor M1 from assisting with the equalization of the bit line BL. The NMOS transistor M2 and the sense amplifier equalization circuit 32 suffer the same problems and cannot perform the desired equalization operation properly. Further, if the equalization time of the bit lines BL and BLB and the equalization time of the P-type sense amplifier and N-type amplifier latch enable signals LA and LAB are extended in order to compensate for the inefficiency of the equalization of these voltage levels, the row precharge time (tRP) of the DRAM device becomes too long, thereby making it difficult to realize a high-speed access.

SUMMARY OF THE INVENTION

The above-described problems may be solved by reducing the loading on the bit line equalization signal line PEQ and the latch enable equalization signal line PLAEQ, and by driving the bit line equalization signal PEQ and the latch enable equalization signal PLAEQ with a voltage level that is greater than an internal power supply voltage.

It is an object of the present invention to provide a memory device capable of realizing a high-speed access at a low power supply voltage.

Another object of the present invention is to reduce a row precharge time in a memory device.

In order to attain the above objects, a memory device in accordance with the present invention includes a sense amplifier circuit that utilizes a divided precharge control scheme to reduce the loading on equalization signal lines. By driving the equalization signal lines at voltage levels that are greater than the internal operating voltage of the device, the row precharge time is reduced, and high-speed access can be achieved even at reduced power supply voltages.

One aspect of the present invention is a dynamic random access memory device including a plurality of bit line pairs for transferring data from memory cells. A bit line equalization circuit is coupled to each of the bit line pairs. Each bit line equalization circuit includes a pair of precharge transistors that precharge the bit lines to a precharge voltage in response to a first bit line equalization signal, and an equalization transistor that equalizes the voltage of the bit lines in response to a second bit line equalization signal.

A bit line equalization signal generator generates the first and second bit line equalization signals in response to a control signal. The voltage level of the first bit line equalization signal is equal to the boost voltage for the device when it is in the high logic state, and the voltage level of the second bit line equalization signal is equal to the external voltage when it is in the high logic state.

The memory device also includes a plurality of sense amplifiers, each of which has a pair of sense amplifier nodes. A plurality of sense amplifier equalization circuits precharges the sense amplifier nodes of corresponding sense amplifiers before a read or write operation is performed. Each sense amplifier equalization circuit includes a pair of precharge transistors that precharge the sense amplifier nodes to the precharge voltage in response to a first latch enable equalization signal, and an equalization transistor that equalizes the voltage of the sense amplifier nodes in response to a second latch enable equalization signal.

A latch enable equalization signal generator similar to the bit line equalization signal generator generates the first and second latch enable equalization signals in response to the control signal.

An advantage of the present invention is that it quickly equalizes the bit lines before a read or write operation. Furthermore, by applying the aforementioned separate precharge scheme, the bit line equalization time can be reduced even further. Therefore, the row precharge time of the device can be shortened, and high-speed access can be realized even though the internal power supply voltage is reduced.

BRIEF DESCRIPTION OF THE DRAWINGS

The present invention will be described by way of exemplary embodiments, but not limitations, illustrated in the accompanying drawings in which like reference designators denote similar elements, and in which.

DETAILED DESCRIPTION

A preferred embodiment according to the present invention will be more fully described below with reference to the accompanying drawings.

Figure 4:
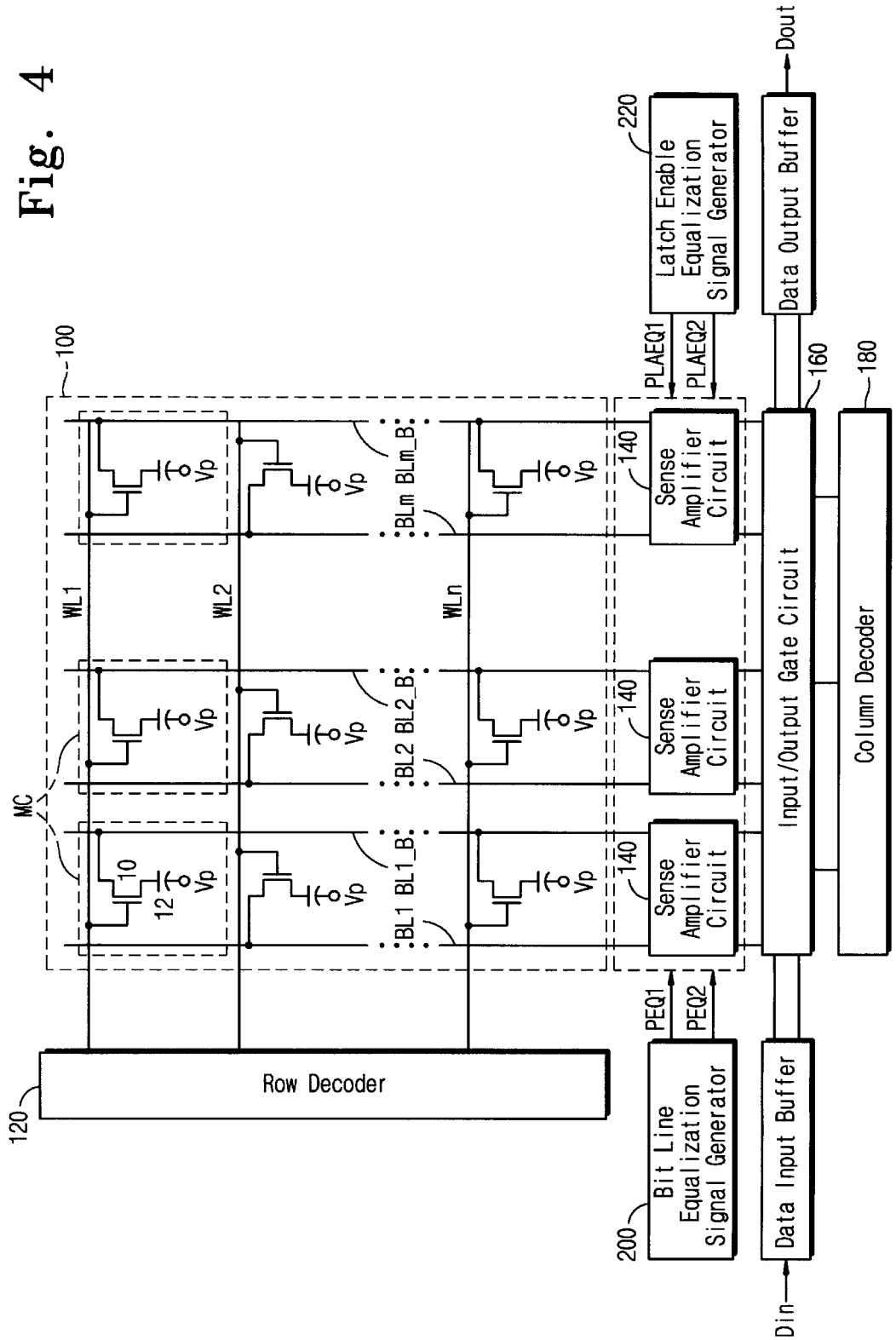
FIG. 4 shows the structure of an embodiment of a dynamic random access memory device according to the present invention.

Referring first to FIG. 4, which shows the structure of an embodiment of a memory cell array and peripheral circuits according to the present invention, each memory cell MC includes an access transistor 10 which serves as a switch, and a capacitor 12 which holds a bit of data. The gates of the access transistors 10 which are arranged in the same row are connected to a common word line WLi, where i=(1, 2, 3, ..., n). The sources of the access transistors 10 which are arranged in a column are connected to alternate lines of a bit line pair BLj and BLjB, where j=(1, 2, ..., m). One electrode of each capacitor 12 is connected to the drain of the corresponding access transistor 10, while the other electrode is connected to a plate voltage $V_P$.

When a row address is supplied, it is decoded by a row decoder 120 into a row address signal and one word line is activated corresponding to the decoded row address, thus turning on all the access transistors 10 connected to the activated word line. The stored charge on all the capacitors 12 corresponding to the activated word line flow onto the corresponding bit lines, respectively. Owing to the relatively low capacitance of the capacitors 12 used in the memory device, sense amplifier circuits 140 are used to amplify the slight effect which the changed capacitor has on the bit line pair. Each of the sense amplifier circuits 140 draws the potential of the bit line having the lower voltage to VSS, and raises the potential of the bit line having the higher voltage up to IVC. Only one of the amplified signals passes through an I/O gate circuit 160 corresponding to a decoded column address from a column decoder 180.

A divided precharge structure is employed in a bit line equalization signal generator 200 which generates a control signal PEQ1 for a bit line equalization operation and a control signal PEQ2 for a bit line precharge operation. Similarly, such a divided precharge structure is employed in a latch enable equalization signal generator 220 which generates a control signal PLAEQ1 for a sense amplifier equalization operation and a control signal PLAEQ2 for a sense amplifier precharge operation. The respective signals PEQ1, PEQ2, PLAEQ1 and PLAEQ2 are driven with a voltage level that is higher than an internal power supply voltage IVC as will be described more fully below.

As a result of the divided precharge structure, loading of the respective lines for transferring the signals PEQ1 and PEQ2 to bit line equalization circuits (refer to FIG. 5, 142) of plural sense amplifier circuits 140 is reduced compared to that of the line for the transmission of the bit line equalization signal PEQ according to the prior art. Also, loading of the respective lines for transferring the signals PLAEQ1 and PLAEQ2 to sense amplifier equalization circuits (refer to FIG. 5, 146) of plural sense amplifier circuits 140 is reduced compared to that of the line for the transmission of the latch enable equalization signal PLAEQ according to the prior art.

Figure 5:
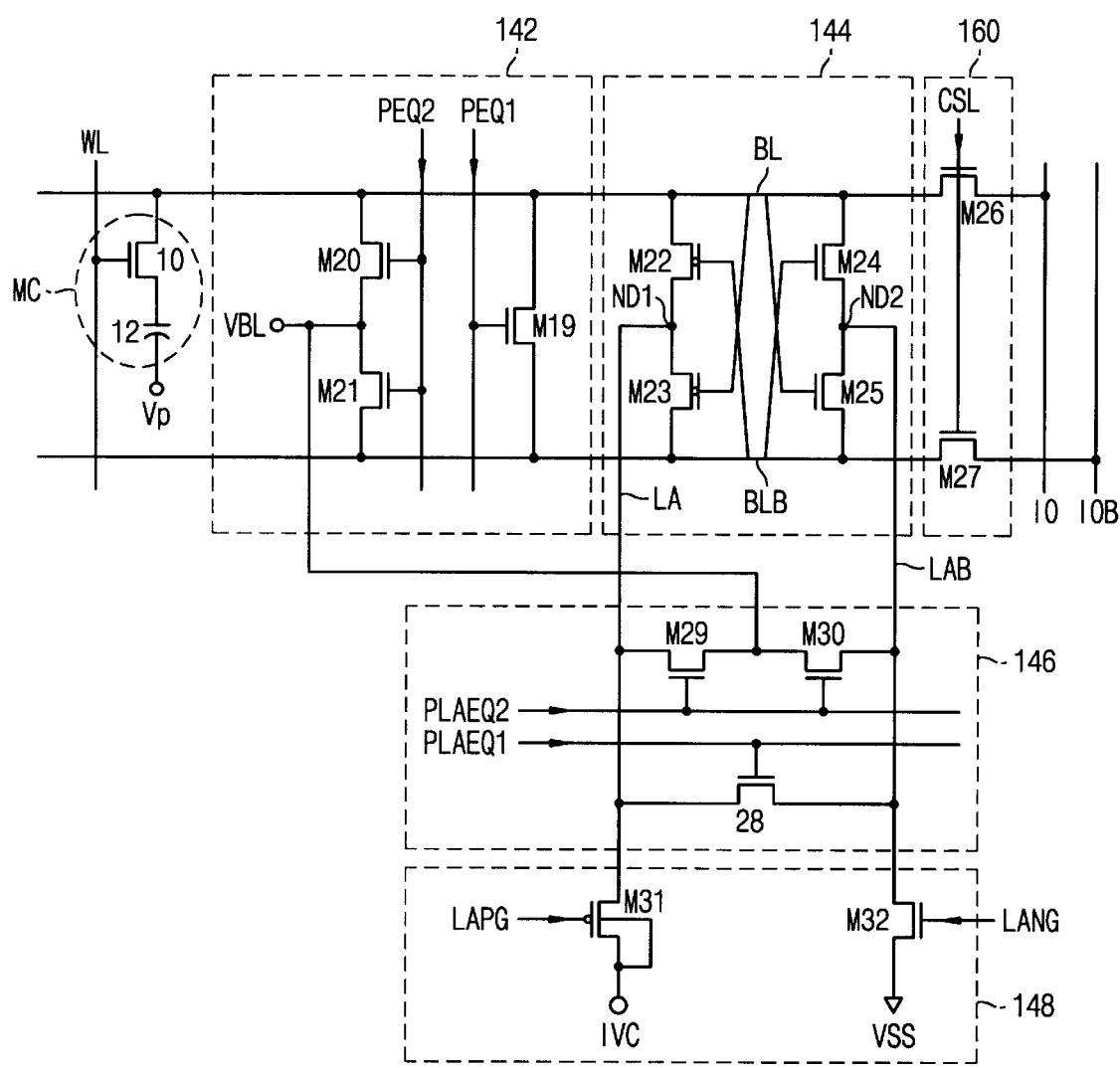
FIG. 5 is a preferred embodiment of a sense amplifier circuit associated with one memory cell according to the present invention.

FIG. 5 is a preferred embodiment of a sense amplifier circuit 140 associated with one memory cell. As illustrated in FIG. 5, there are provided in the sense amplifier circuit 120 a pair of bit lines BL and BLB, a bit line equalization circuit 142, a sense amplifier 144, a column select gate 160, a sense amplifier equalization circuit 146, and a sense amplifier activating circuit 148. The bit lines BL and BLB to which data is transferred are connected to the memory cell MC. The bit line equalization circuit 142 of this embodiment receives a precharge voltage VBL (having a level intermediate between the voltages IVC and VSS) and responds to the signals (hereinafter, referred to as "bit line equalization signals") PEQ1 and PEQ2 to equalize the bit lines BL and BLB to the precharge voltage level VBL before a read operation or a write operation is performed.

The sense amplifier 144 differentially amplifies the data transferred from the memory cell MC to the bit lines BL and BLB. The column select gate 160 connects the bit lines BL and BLB to the input/output lines IO and IOB responsive to the column select line CSL. The sense amplifier equalization circuit 146 equalizes the sense amplifier nodes ND1 and ND2 to the precharge voltage VBL in response to the signal PLAEQ1 and PLAEQ2 (hereinafter, referred to as "latch enable equalization signals"). Once equalized, P-type sense amplifier and N-type sense amplifier latch enable signals LA and LAB, which control the sense amplifier 144, are activated by the sense amplifier activating circuit 148, which is connected to the sense amplifier equalization circuit 146 and receives signals LAPG and LANG.

As illustrated in FIG. 5, each memory cell MC has an access transistor 10 coupled to a word line WL and a bit line BL, and a capacitor 12 coupled between the access transistor 10 and the plate voltage $V_P$. The bit line equalization circuit 142 has three NMOS transistors M19, M20 and M21 connected between the bit lines BL and BLB. The equalization transistor M19, whose gate electrode receives the bit line equalization signal PEQ1, has a current path formed between the bit lines BL and BLB. The precharge transistors M20 and M21 have gate electrodes receiving the bit line equalization signal PEQ2. Further, the precharge voltage VBL is input to the source electrodes of the NMOS transistors M20 and M21, which have drain electrodes connected to corresponding bit lines BL and BLB, respectively.

The sense amplifier equalization circuit 146 has three NMOS transistors M28, M29 and M30. The latch enable equalization signal PLAEQ1 is input to the gate electrode of the equalization transistor M28, with its current path formed between the sense amplifier nodes ND1 and ND2. The gate electrodes of the precharge transistors M29 and M30 are collectively connected to the sense amplifier precharge signal PLAEQ2, and the transistors M29 and M30 are connected in series between the sense amplifier nodes ND1 and ND2. Further, the precharge voltage VBL is input to the common source electrodes of the NMOS transistors M29 and M30.

Figure 1:
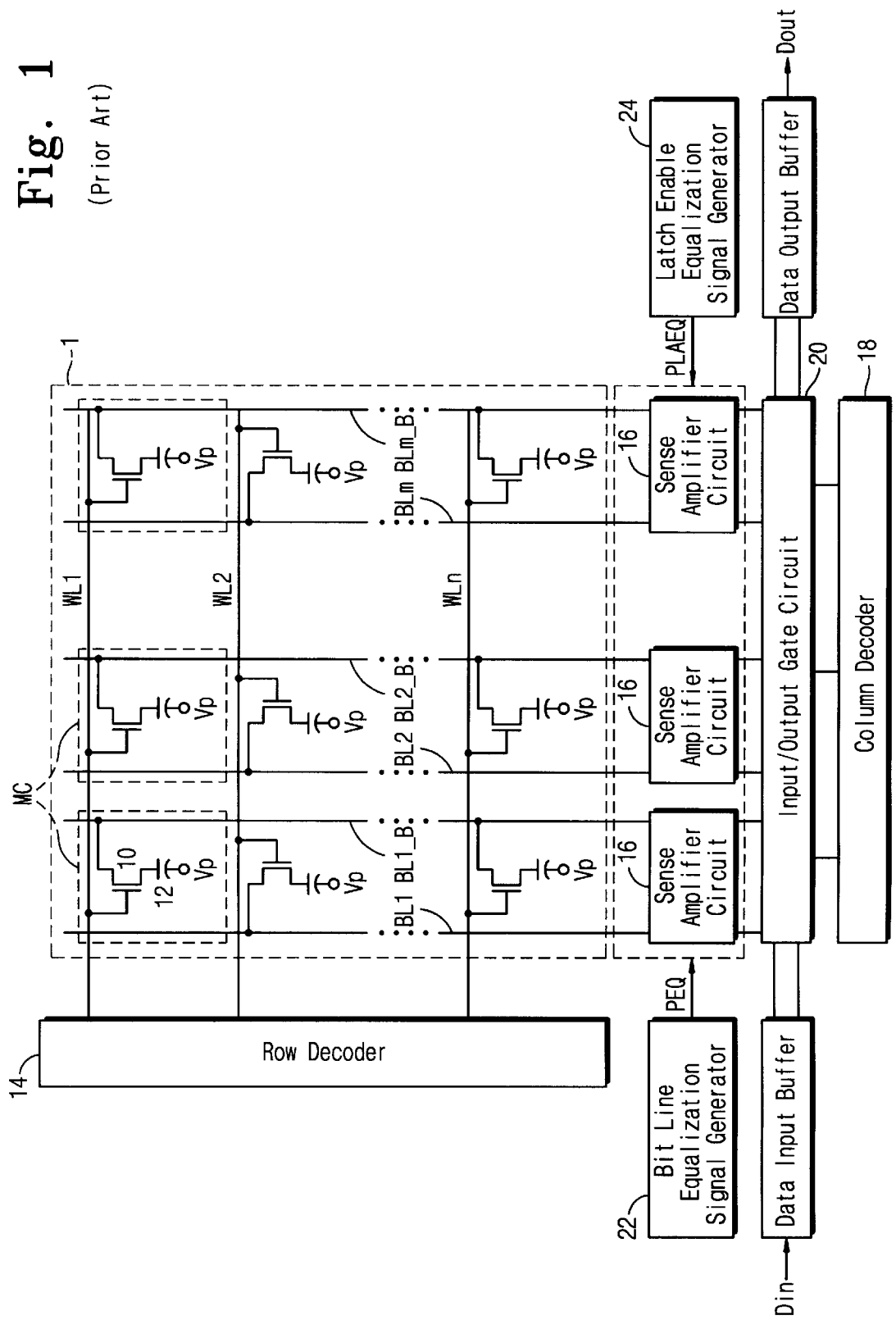
FIG. 1 shows the structure of a conventional dynamic random access memory device.
Figure 2:
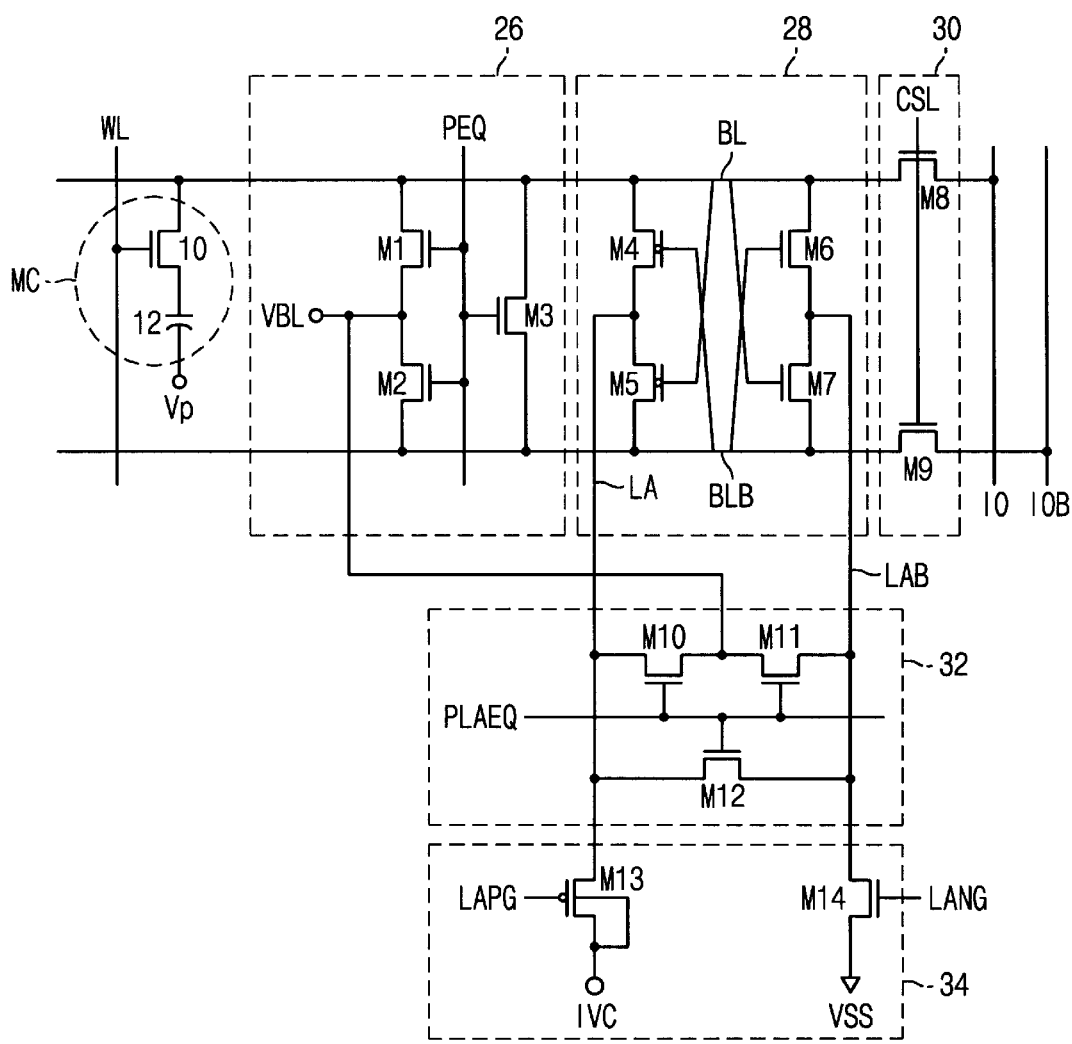
FIG. 2 shows a circuit diagram of a conventional sense amplifier circuit associated with one memory cell in FIG. 1.
Figure 3A:
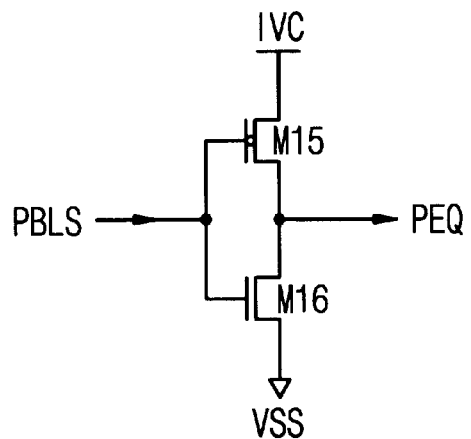
FIG. 3A shows an example of a conventional bit line equalization signal generator illustrated in FIG. 1.
Figure 3B:
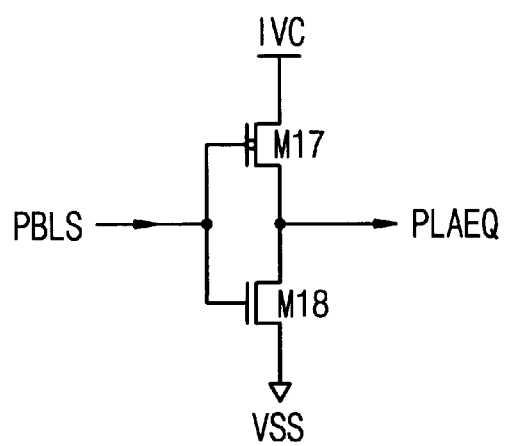
FIG. 3B shows an example of a conventional latch enable equalization signal generator illustrated in FIG. 1.

In FIG. 5, the sense amplifier 144, the sense amplifier activating circuit 148 and the column select gate 160 are configured similarly to those of FIG. 2, and description thereof is thus omitted.

Figure 6:
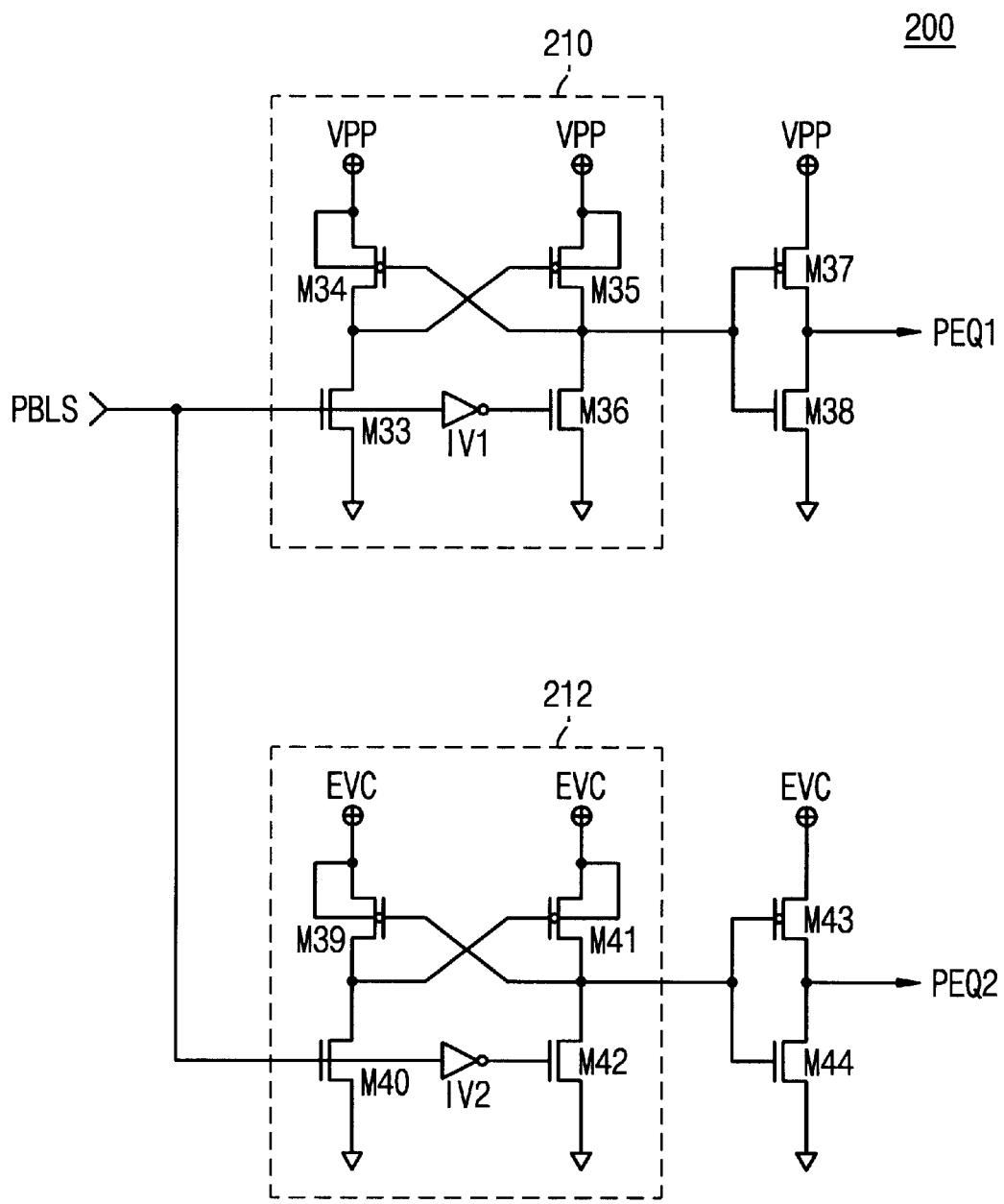
FIG. 6 shows a preferred embodiment of a bit line equalization signal generator illustrated in FIG. 4.

FIG. 6 shows a preferred embodiment of a bit line equalization signal generator 200 illustrated in FIG. 4. The bit line equalization signal generator 200 generates the bit line equalization signals PEQ1 and PEQ2 in response to a control signal PBLS, and includes two level shifters 210 and 212, two PMOS transistors M37 and M43, and two NMOS transistors M38 and M44 connected as illustrated in FIG. 6. The bit line equalization signal PEQ1 is maintained at either the level of the ground voltage VSS or a boost voltage VPP, which is higher than the internal and external power supply voltages IVC and EVC, in response to the logic level of the control signal PBLS. The bit line equalization signal PEQ2 is maintained at VSS or the external power supply voltage EVC, which is higher than the internal power supply voltage IVC, in response to the logic level of the control signal PBLS.

Figure 7:
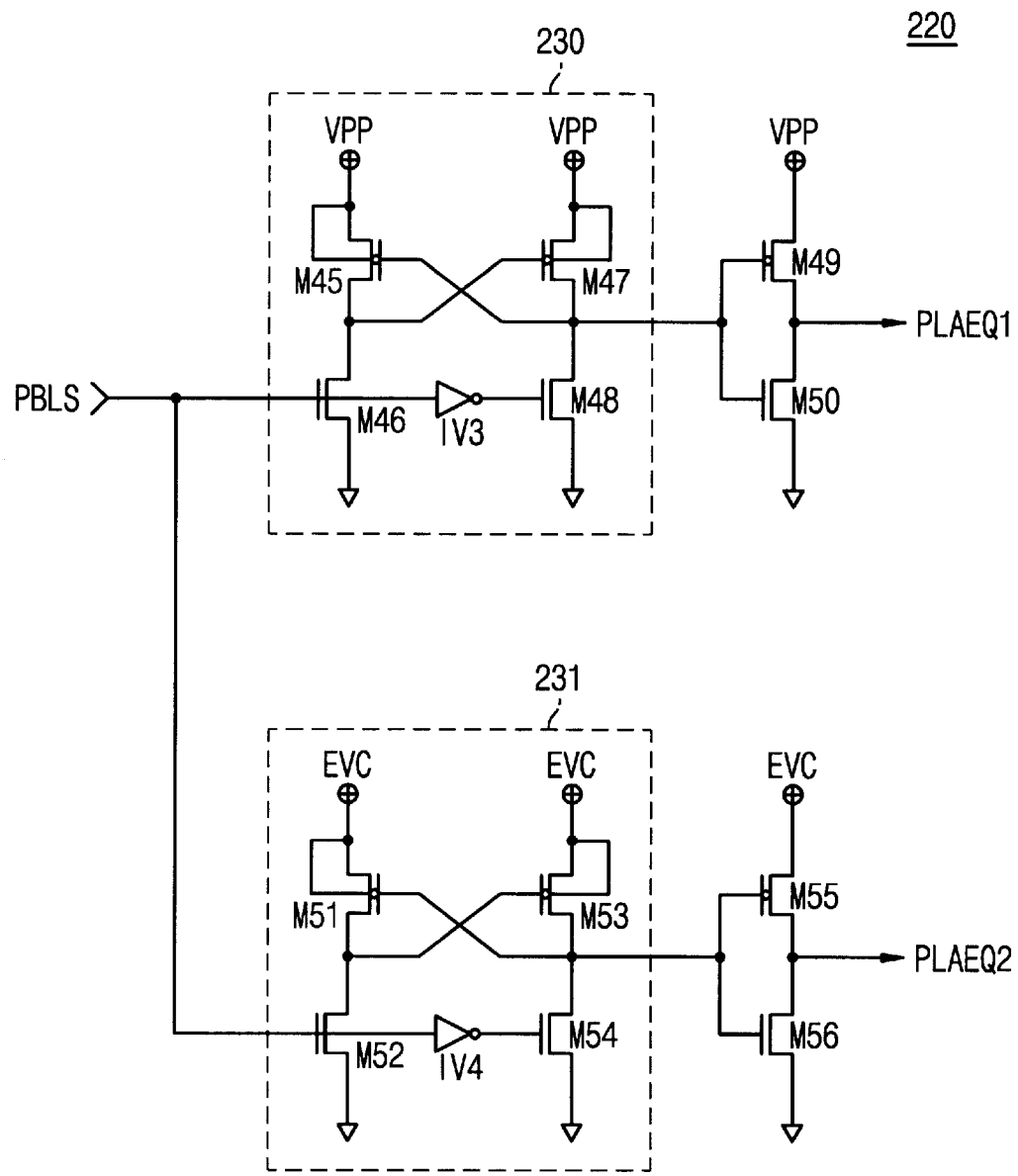
FIG. 7 shows a preferred embodiment of a latch enable equalization signal generator illustrated in FIG. 4.

FIG. 7 shows a preferred embodiment of a latch enable equalization signal generator 220 illustrated in FIG. 4. The latch enable equalization signal generator 220 generates the latch enable equalization signals PLAEQ1 and PLAEQ2 in response to the control signal PBLS, and includes two level shifters 230 and 231, two PMOS transistors M49 and M55, and two NMOS transistor M50 and M56 connected as illustrated in FIG. 7. The latch enable equalization signal PLAEQ1 is maintained at VSS or the boost voltage VPP in response to the control signal PBLS. The latch enable equalization signal PLAEQ2 is maintained at VSS or EVC in response to the logic level of the control signal PBLS. The control signal PBLS used by the generators 200 and 220 of FIGS. 6 and 7 is provides block select information to determine whether a corresponding sense amplifier is enabled.

A boost circuit which provides the boost voltage VPP as is known in the art, can be advantageously implemented with the present invention. Such a boost circuit is disclosed in U.S. Pat. No. 5,367,489, which is hereby expressly incorporated by reference.

A read operation for a dynamic random access memory device according to the present invention will now be more fully described with reference to the accompanying drawings.

When the bit line equalization signals PEQ1 and PEQ2 are activated, i.e., switched from the low level to the high level, the bit line equalization signals PEQ1 and PEQ2 are driven at the boost voltage VPP and the external power supply voltage EVC, respectively. This causes the NMOS transistors M19, M20 and M21 to turn on, and the bit lines BL and BLB are thus equalized to a voltage level of ½IVC. When the latch enable equalization signals PLAEQ1 and PLAEQ2 input to the sense amplifier equalization circuit 146 are maintained at the high level, that is, at the voltages VPP and EVC, respectively, the P-type sense amplifier and N-type sense amplifier latch enable signals LA and LAB are also equalized to ½IVC. The bit line equalization signals PEQ1 and PEQ2 are deactivated to disable the bit line equalization circuit 142 before the word line WL is enabled. Similarly, the latch enable equalization signals PLAEQ1 and PLAEQ2 for equalizing the P-type sense amplifier and N-type sense amplifier latch enable signals LA and LAB are also deactivated before the word line WL is enabled.

Assuming that the memory cell MC is storing cell data at a logic "1" level, when the word line WL is enabled, the voltage level of the bit line BL increases by $\Delta$VBL due to charge sharing between the bit line BL and the cell capacitor 12. After the charge sharing is completed, if the N-type sense amplifier activating signal LANG is driven to the logic high level, the voltage level of the N-type sense amplifier enable signal LAB is lower than the level of the precharge voltage VBL, and the NMOS transistors M24 and M25 are turned on to perform a sensing operation. Since the voltage level of the bit line BL is higher than that of the bit line BLB, the transistor M25 is thus turned on much more than transistor M24. This causes the bit line BLB to fall to a lower voltage level while the level of the bit line BL remains at its level of ½IVC+$\Delta$VBL.

As the voltage level of the bit line BLB falls, the P-type sense amplifier activating signal LAPG is driven to the low level and the PMOS transistor M31 is thus turned on, so that the PMOS transistors M22 and M23 are turned on. At this time, since the PMOS transistor M22 is more easily turned on than the PMOS transistor M23, the difference between the voltages of the bit lines BL and BLB increases. During a read operation, once the difference of the voltages between the bit lines BL and BLB is more than a certain level, the column select line CSL is enabled to the high level and the NMOS transistors M26 and M27 are turned on. The bit lines BL and BLB are thus connected to the input/output lines IO and IOB and the data from the bit line is transferred to the input/output line.

Figure 8:
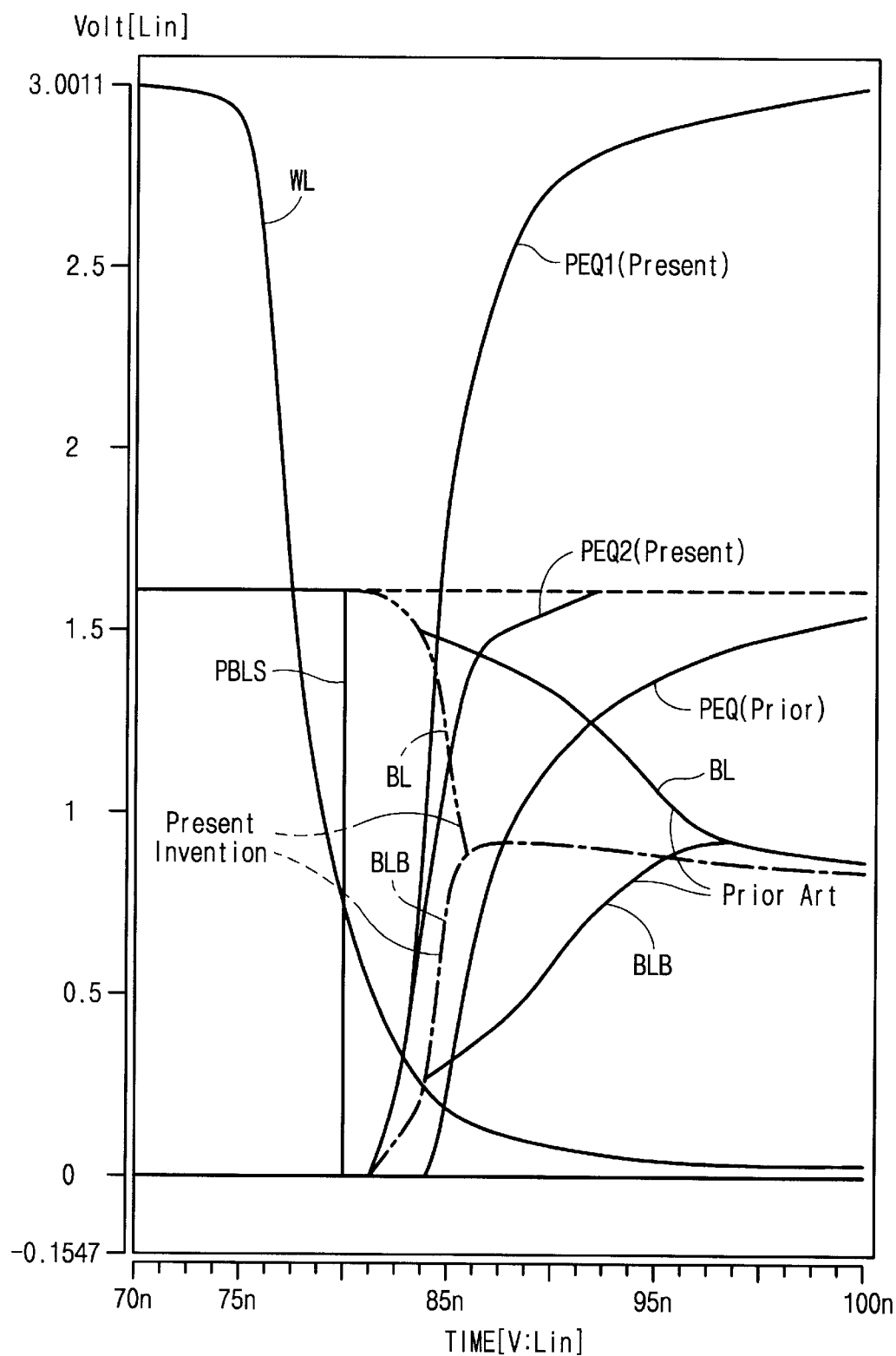
FIG. 8 is a diagram for comparing a bit line precharge time in accordance with the present invention with a bit line precharge time in accordance with the prior art.

As described above, the bit line equalization signals PEQ1 and PEQ2 are maintained at the low level during the bit line sensing operation. Moreover, while the equalization operation is performed, the bit line equalization signals PEQ1 and PEQ2 are maintained at the levels of the boost voltage VPP and the external power supply EVC, respectively. When these voltages VPP and EVC are used, the NMOS transistors M19, M20 and M21 of the equalization circuit 142 shown in FIG. 5 are turned on sufficiently during the equalization of the bit lines BL and BLB. When the bit lines BL and BLB arrive at the voltage level of ½IVC, the gate-source voltages of the NMOS transistors M19 to M21 are greater than about 2.3V. Therefore, even if the threshold voltages of the transistors M19 to M21 are given as Vt≧1V due to the body effect, it is possible to quickly equalize the bit lines. Accordingly, the bit line precharge time is reduced as compared with that of the prior art, as illustrated in FIG. 8. This enables the row precharge time (tRP) to be reduced, thus providing high-speed access at a low power supply voltage.

The operation of the latch enable equalization signal generator 220 is performed in the same manner as that of the bit line equalization signal generator 200 of FIG. 7.

The latch enable equalization signal PLAEQ1 and PLAEQ2 are maintained at the boost voltage VPP and the external power supply voltage EVC, respectively, while the equalization operations are performed on the P-type sense amplifier and N-type sense amplifier latch enable signal LA and LAB. The NMOS transistors M28, M29 and M30 of the sense amplifier equalization circuit 146 are thus turned on during the equalization operation of the signals LA and LAB. When the sense amplifier nodes ND1 and ND2 arrive at the voltage level of ½IVC, the gate-source voltages of the transistors M28 to M30 are more than 2.3V. Therefore, even if the threshold voltages of the transistors M28 to M30 are given as Vt≧1V due to the body effect, it is possible to quickly equalize the latch enable signals LA and LAB.

Furthermore, in the prior art, a signal PEQ for controlling the bit line equalization circuit 26 of the respective sense amplifier circuits 16 is transferred via one signal line which is collectively connected to plural bit line equalization circuits. However, with the present invention, the bit line equalization signal PEQ is divided into two signal lines for transferring corresponding bit line equalization signals PEQ1 and PEQ2, thereby reducing the loading of the respective signal lines. By applying the aforementioned separate precharge scheme, the bit line equalization time can be reduced, as illustrated in FIG. 8. Therefore, the row precharge time (tRP) of the DRAM device can be reduced, and high-speed access can be realized even though the internal power supply voltage IVC is reduced.

The invention has been described using exemplary preferred embodiments. However, it is to be understood that the scope of the invention is not limited to the disclosed embodiments. On the contrary, it is intended to cover various modifications and similar arrangements. For example, transistors are shown above as NMOS and PMOS transistors having gates which control current flow through channels. However, other types of devices can be used to control the flow of current through a current path. The scope of the claims, therefore, should be accorded the broadest interpretation so as to encompass all such modifications and similar arrangements.

What is claimed is:

1. A semiconductor memory device comprising:

an array having a plurality of memory cells;

a pair of bit lines coupled to the array;

a bit line equalization circuit coupled to the bit lines for precharging the bit lines with a precharge voltage prior to a read/write operation, wherein the bit line equalization circuit is activated by first and second bit line equalization signals having voltage levels that are substantially greater than an operating voltage of the device; and a bit line equalization signal generator coupled to the bit line equalization circuit for generating the first and second bit line equalization signals;

wherein the first bit line equalization signal has a high level equal to a boost voltage which is greater than an external power supply voltage.

2. The integrated circuit memory device according to claim 1, wherein the operating voltage is an internal power supply voltage, and the precharge voltage is intermediate between the internal power supply voltage and a ground voltage.

3. The integrated circuit memory device according to claim 2, wherein the second bit line equalization signal has a high level which is equal to an external power supply voltage.

4. The integrated circuit memory device according to claim 3, wherein the bit line equalization circuit comprises:

a first transistor having a gate electrode coupled to receive the first bit line equalization signal and a current path coupled between the bit lines;

a second transistor having a gate electrode coupled to receive the second bit line equalization signal and a current path coupled between one of the bit lines and a terminal for receiving the precharge voltage; and a third transistor having a gate electrode coupled to receive the second bit line equalization signal and a current path coupled between the other one of the bit lines and the terminal for receiving the precharge voltage.

5. An integrated circuit memory device comprising:

an array having a plurality of memory cells;

a pair of bit lines coupled to the array;

a sense amplifier coupled to the bit lines for amplifying a difference between voltages on the bit lines, wherein the sense amplifier includes first and second sense amplifier nodes;

a sense amplifier equalization circuit coupled to the sense amplifier for precharging the sense amplifier nodes with a precharge voltage prior to a read/write operation, wherein the sense amplifier equalization circuit is activated by first and second latch enable equalization signals having voltage levels that are substantially greater than an operating voltage of the device; and a latch enable equalization signal generator coupled to the sense amplifier equalization circuit for generating the first and second latch enable equalization signals.

6. The integrated circuit memory device according to claim 5, wherein:

the first latch enable equalization signal has a high level equal to a boost voltage level which is greater than an external power supply voltage; and the second latch enable equalization signal has a high level equal to an external power supply voltage.

7. The integrated circuit memory device according to claim 6, wherein the operating voltage is an internal power supply voltage, and the precharge voltage is intermediate between the internal power supply voltage and a ground voltage.

8. The integrated circuit memory device according to claim 7, wherein the sense amplifier equalization circuit comprises:

a first transistor having a gate electrode coupled to receive the first latch enable equalization signal and a current path coupled between the first and second sense amplifier nodes;

a second transistor having a gate electrode coupled to receive the second latch enable equalization signal and a current path coupled between one of the sense amplifier nodes and a terminal for receiving the precharge voltage;

a third transistor having a gate electrode coupled to receive the second latch enable equalization signal and a current path coupled between the other one of the sense amplifier nodes and the terminal for receiving the precharge voltage.

9. A dynamic random access memory comprising:

a plurality of word lines arranged in a row direction;

a plurality of bit lines forming a plurality of pairs of bit lines which are arranged in a column direction;

a plurality of memory cells connected between each of the plurality of bit line pairs via a plurality of access transistors, the access transistors being controlled by different ones of the word lines;

a plurality of bit line equalization circuits coupled to corresponding bit line pairs, wherein each of the bit line equalization circuits precharges a corresponding pair of bit lines with a precharge voltage before a read or write operation is performed, wherein the bit line equalization circuits are activated by both a first bit line equalization signal having a voltage level equal to a boost voltage and a second bit line equalization signal having a voltage level equal to an external power supply voltage;

a bit line equalization signal generator coupled to the bit line equalization circuits for generating the first and second bit line equalization signals;

a plurality of sense amplifiers coupled to corresponding ones of the bit line pairs, wherein each sense amplifiers has a pair of sense amplifier nodes;

a plurality of sense amplifier equalization circuits coupled to corresponding ones of the sense amplifiers, wherein each of the sense amplifier equalization circuits precharges the sense amplifier nodes of a corresponding sense amplifier before a read or write operation is performed, and wherein the sense amplifier equalization circuits are activated by both a first latch enable equalization signal having a voltage equal the boost voltage and a second latch enable equalization signal having a voltage equal to the external power supply voltage; and a latch enable equalization signal generator coupled to the sense amplifier equalization circuits for generating the first and second latch enable equalization signals.

10. The dynamic random access memory device according to claim 9, wherein:

each of the bit line equalization circuits includes a first transistor having a gate electrode coupled to receive the first bit line equalization signal and a current path coupled between the corresponding bit lines, a second transistor having a gate electrode coupled to receive the second bit line equalization signal and a current path coupled between one of the corresponding bit lines and a terminal for receiving the precharge voltage, a third transistor having a gate electrode coupled to receive the second bit line equalization signal and a current path coupled between the other one of the corresponding bit lines and the terminal for receiving the precharge voltage; and each of the sense amplifier equalization circuits includes a first transistor having a gate electrode coupled to receive the first latch enable equalization signal and a current path coupled between the sense amplifier nodes of the corresponding sense amplifier, a second transistor having a gate electrode coupled to receive the second latch enable equalization signal and a current path coupled between one of the corresponding sense amplifier nodes and a terminal for receiving the precharge voltage, and a third transistor having a gate electrode coupled to receive the second latch enable equalization signal and a current path coupled between the other of the corresponding sense amplifier nodes and the terminal for receiving the precharge voltage.

11. A method for operating an equalization circuit for a sense amplifier circuit in a memory device, wherein the equalization circuit includes a precharge transistor for precharging a first terminal and an equalization transistor for equalizing the first terminal and a second terminal, the method comprising:

driving the precharge transistor with a first equalization signal; and driving the equalization transistor with a second equalization signal.

12. A method according to claim 11 wherein:

the memory device operates at an operating voltage;

the first equalization signal has a first voltage that is greater than the operating voltage; and the second equalization signal has a second voltage that is greater than the operating voltage.

13. A method according to claim 12 wherein:

the operating voltage is an internal voltage for an integrated circuit on which the memory device is fabricated;

the first voltage is a boost voltage for the integrated circuit; and the second voltage is an external power supply voltage for the integrated circuit.

14. A method according to claim 11 wherein the equalization circuit further includes a second precharge transistor for precharging the second terminal, the method further including driving the second precharge transistor with the first equalization signal.

15. A method according to claim 11 wherein:

the equalization circuit is a bit line equalization circuit; and the first and second terminals are a pair of bit lines.

16. A method according to claim 11 wherein:

the equalization circuit is a sense amplifier equalization circuit; and the first and second terminals are a pair of sense amplifier nodes.

17. A method according to claim 11 further including generating the first and second equalization signals responsive to a control signal.

18. A method according to claim 17 wherein generating the first and second equalization signals responsive to a control signal includes level shifting the control signal.

* * * * *